(12) United States Patent
Yang et al.

(10) Patent No.: US 12,266,616 B2
(45) Date of Patent: Apr. 1, 2025

(54) INTEGRATED CIRCUIT PACKAGE STRUCTURE

(71) Applicant: Unimicron Technology Corp., Taoyuan (TW)

(72) Inventors: Kai-Ming Yang, Hsinchu County (TW); Chia-Yu Peng, Taoyuan (TW); John Hon-Shing Lau, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 18/470,427

(22) Filed: Sep. 20, 2023

(65) Prior Publication Data

US 2024/0014145 A1    Jan. 11, 2024

Related U.S. Application Data

(62) Division of application No. 17/086,475, filed on Nov. 2, 2020, now Pat. No. 11,824,012.

(30) Foreign Application Priority Data

Aug. 27, 2020   (TW) ................................. 109129326

(51) Int. Cl.
*H01L 23/552*   (2006.01)
*H01L 21/56*    (2006.01)
(Continued)

(52) U.S. Cl.
CPC .......... *H01L 23/552* (2013.01); *H01L 21/561* (2013.01); *H01L 21/78* (2013.01);
(Continued)

(58) Field of Classification Search
CPC ..... H01L 23/552; H01L 21/561; H01L 21/78; H01L 24/13; H01L 2224/13024; H01L 2924/182; H01L 33/48
See application file for complete search history.

(56) References Cited

U.S. PATENT DOCUMENTS

2018/0138155 A1    5/2018   Kim et al.
2018/0323170 A1*  11/2018   Kim .................. H01L 21/56

FOREIGN PATENT DOCUMENTS

KR    20090080879          7/2009
WO    WO-2021253573 A1 *  12/2021 ......... H01L 21/4853

OTHER PUBLICATIONS

"Office Action of China Counterpart Application", issued on Jul. 23, 2024, p. 1-p. 8.

* cited by examiner

*Primary Examiner* — Mohammad M Choudhry
(74) *Attorney, Agent, or Firm* — JCIPRNET

(57) ABSTRACT

An integrated circuit (IC) package structure includes a chip, a redistribution layer (RDL) structure, a molding compound structure and an electromagnetic interference (EMI) shielding structure. The RDL structure is formed on the chip and electrically connected thereto. The molding compound layer is provided on outer surfaces of the chip and the RDL structure. The EMI shielding structure is provided on outer surfaces of the molding compound structure. The molding compound structure layer provided on outer surfaces of the chip and the RDL structure provide protection and reinforcement to multiple faces of the IC package structure; and the EMI shielding structure provided on outer surfaces of the molding compound structure provides EMI protection to multiple faces of the chip and the RDL structure.

4 Claims, 19 Drawing Sheets

(51) Int. Cl.
*H01L 21/78* (2006.01)
*H01L 23/00* (2006.01)
(52) U.S. Cl.
CPC .... *H01L 24/13* (2013.01); *H01L 2224/13024* (2013.01); *H01L 2924/182* (2013.01)

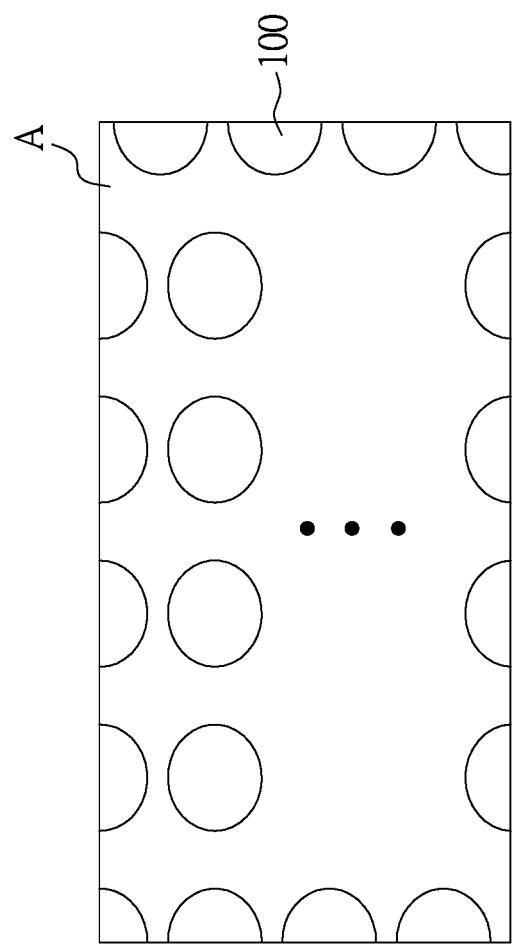

INTEGRATED CIRCUIT PACKAGE STRUCTURE

CROSS-REFERENCE TO RELATED APPLICATION

This application is a divisional application of U.S. application Ser. No. 17/086,475, filed on Nov. 2, 2020, now allowed, which claims the priority benefit of Taiwan application serial no. 109129326, filed on Aug. 27, 2020. The entirety of each of the above-mentioned patent applications is hereby incorporated by reference herein and made a part of this specification.

BACKGROUND OF THE INVENTION

1. Field of the Invention

The present disclosure relates to an integrated circuit (IC) package structure, and in particular to an IC package structure that ensures effective protection of entire IC package structural strength and protection against electromagnetic interference (EMI). The present disclosure also relates to a method for manufacturing the above IC package structure.

2. Description of the Related Art

A conventional method for packaging a chip includes the steps of forming a plurality of cutting grooves on a back side of a wafer; providing a molding compound layer on the back side of the wafer and in the cutting grooves; providing a redistribution layer (RDL) structure on a front side of the wafer; and cutting the wafer along the cutting grooves to produce a plurality of chips.

In the above described conventional method for packaging a chip, the molding compound layer is provided before the provision of the RDL structure. Therefore, outer surfaces of the RDL structure are not effectively protected by the molding compound layer. In this case, the RDL structure is subjected to be damages in subsequent assembling processes.

Further, since there is not any electromagnetic interference (EMI) protection structure provided in the conventional chip packaging, the chip so packaged tends to be affected by electromagnetic interference when it is in use later. In a minor condition, the chip might have reduced performance only. However, in a worse condition, the chip might be damaged and becomes useless.

BRIEF SUMMARY OF THE INVENTION

In view of the problems in the conventional IC packaging, an objective of the present disclosure is to provide an improved IC package structure and a manufacturing method thereof, in which a molding compound layer and an electromagnetic interference (EMI) shielding structure are sequentially provided on outer surfaces of a chip and on outer surfaces of a redistribution layer (RDL) structure formed on the chip, so as to protect and enhance the structural strength of the IC package structure and to protect the chip and the RDL structure against EMI. The IC package structure so formed is stronger, more reliable and more stable for use.

To achieve at least the above objective, the IC package structure provided according to the present disclosure includes:

a chip;

a redistribution layer (RDL) structure provided on the chip and be electrically connected thereto;

a molding compound structure provided on outer surfaces of the chip and on outer surfaces of the RDL structure; and an electromagnetic interference (EMI) shielding structure provided on outer surfaces of the molding compound structure.

In an embodiment, the molding compound structure includes a first molding compound layer provided on a plurality of outer side surfaces of the chip and a plurality of outer side surfaces of the RDL structure; and a second molding compound layer provided on a bottom surface of the chip and connected to the first molding compound layer.

In an embodiment, the EMI shielding structure includes a first EMI shielding layer provided on a plurality of outer side surfaces of the first molding compound layer and on a plurality of outer side surface and a bottom surface of the second molding compound layer.

In an embodiment, the molding compound structure includes a first molding compound layer provided on a plurality of outer side surfaces of the chip and on a plurality of outer side surfaces of the RDL structure; and the EMI shielding structure includes a first EMI shielding layer provided on a plurality of outer side surfaces of the first molding compound layer.

In an embodiment, the second molding compound layer is formed on its bottom surface with a plurality of recesses; and the recesses are filled up by the first EMI shielding layer.

In another embodiment, the second molding compound layer is formed with a plurality of through holes, which are extended through the second molding compound layer in a thickness direction thereof; and the first EMI shielding layer fills up the through holes and is connected to the bottom surface of the chip.

In an embodiment, the molding compound structure includes a first molding compound layer provided on a plurality of outer side surfaces of the chip and on a plurality of outer side surfaces and a top surface of the RDL structure, and a second molding compound layer provided on a bottom surface of the chip and connected to the first molding compound layer. Wherein, an electrical connecting layer provided on the top surface of the RDL structure is partially exposed from the first molding compound layer.

In the above embodiment, the EMI shielding structure includes a first EMI shielding layer provided on a plurality of outer side surfaces of the first molding compound layer and on a plurality of outer side surfaces and a bottom surface of the second molding compound layer.

In the above embodiment, the second molding compound layer is formed with a plurality of recesses, and the recesses are filled up by the first EMI shielding layer.

In another embodiment, the second molding compound layer is formed with a plurality of through holes, which are extended through the second molding compound layer in a thickness direction thereof; and the first EMI shielding layer fills up the through holes and is connected to the chip.

In an embodiment, the EMI shielding structure includes a first EMI shielding layer provided on a plurality of outer side surfaces of the first molding compound layer and on a plurality of outer side surfaces and a bottom surface of the second molding compound layer; and a second EMI shielding layer provided on the first molding compound layer formed on the top surface of the RDL structure and being spaced from the exposed electrical connecting layer.

In the above embodiment, the second molding compound layer is formed with a plurality of recesses; and the recesses being filled up by the first EMI shielding layer.

In another embodiment, the second molding compound layer is formed with a plurality of through holes, which are extended through the second molding compound layer in a thickness direction thereof; and the first EMI shielding layer fills up the through holes and is connected to the bottom surface of the chip.

To achieve at least the above objective, the method of manufacturing the IC package structure according to the present disclosure includes the following steps:

providing one than one wafer;

forming a redistribution layer (RDL) structure on a top surface of the wafer;

forming a plurality of first cutting grooves on the wafer and the RDL structure correspondingly provided thereon in order to form a plurality of chips, each of which has the RDL structure correspondingly provided thereon;

forming a first molding compound layer of a molding compound structure on the wafer and the RDL structure correspondingly provided thereon and in the first cutting grooves correspondingly formed on the wafer and the RDL structure;

processing a bottom surface of the wafer to expose a bottom surface of each of the chips to be formed on the wafer and to expose portions of the first molding compound layer that are filled in the first cutting grooves on the wafer; and then, forming a second molding compound layer of the molding compound structure on the bottom surfaces of the chips and on the exposed portions of the first molding compound layer;

forming a plurality of second cutting grooves on the portions of the first molding compound layer that are filled in the first cutting grooves and on portions of the second molding compound layer that are located corresponding to the first cutting grooves, so as to separate the chips from one another;

providing an electromagnetic interference (EMI) shielding structure on outer surfaces of the first and the second molding compound layer on each of the chips; and exposing the RDL structure on each of the chips.

In an embodiment, in the step of exposing the RDL structure on each of the chips, portions of the first molding compound layer located on a top surface of the RDL structure on each of the chips and portions of the EMI shielding structure located corresponding to the above portions of the first molding compound layer are removed, so that a top surface of the RDL structure and an electrical connecting layer provided on the RDL structure on each of the chips are exposed.

In the above embodiment, the second molding layer on each of the chips is provided with a plurality of recesses before the step of forming the EMI shielding structure on outer surfaces of the first and the second molding compound layer on each of the chips; and the recesses are filled up by the EMI shielding structure when the latter is formed to thereby constitute a heat dissipation structure.

In another embodiment, the second molding layer on each of the chips is provided with a plurality of through holes before the step of forming the EMI shielding structure on outer surfaces of the first and the second molding compound layer on each of the chips; the through holes are extended through the second molding compound layer in a thickness direction thereof; and the EMI shielding structure fills up the through holes and is connected to the bottom surface of the chip when the EMI shielding structure is formed.

In an embodiment, in the step of exposing the RDL structure on each of the chips, some portions of the first molding compound layer and some portions of the EMI shielding structure located corresponding to the above portions of the first molding compound layer are removed, so that remained portions of the first molding compound layer cover a top surface of the RDL structure and the electrical connecting layer provided on the RDL structure on each of the chips are exposed.

In an embodiment, the second molding compound layer on each of the chips is provided with a plurality of recesses before the step of forming the EMI shielding structure on outer surfaces of the first and the second molding compound layer on each of the chips; and the recesses are filled up by the EMI shielding structure when the latter is formed.

In another embodiment, the second molding layer on each of the chips is provided with a plurality of through holes before the step of forming the EMI shielding structure on outer surfaces of the first and the second molding compound layer on each of the chips; the through holes are extended through the second molding compound layer in a thickness direction thereof; and the EMI shielding structure fills up the through holes and is connected to the bottom surface of the chip when the EMI shielding structure is formed.

In an embodiment, in the step of providing an electromagnetic interference (EMI) shielding structure on outer surfaces of the first and the second molding compound layer on each of the chips, a first EMI shielding layer of the EMI shielding structure is formed on a plurality of outer side surfaces of the first molding compound layer and on a plurality of outer side surfaces and a bottom surface of the second molding compound layer on each of the chips; and a second EMI shielding layer of the EMI shielding structure is formed on portions of the first molding compound layer that are located on the RDL structure of each of the chips; wherein the second EMI shielding layer is spaced from the exposed electrical connecting layer on the RDL structure.

In the above embodiment, the second molding layer on each of the chips is provided with a plurality of recesses before the step of forming the EMI shielding structure on outer surfaces of the first and the second molding compound layer on each of the chips; and the recesses are filled up by the EMI shielding structure when the latter is formed to thereby constitute a heat dissipation structure.

In another embodiment, the second molding layer on each of the chips is provided with a plurality of through holes before the step of forming the EMI shielding structure on outer surfaces of the first and the second molding compound layer on each of the chips; the through holes are extended through the second molding compound layer in a thickness direction thereof; and the EMI shielding structure fills up the through holes and is connected to the bottom surface of the chip when the EMI shielding structure is formed.

In an embodiment, the method of manufacturing IC package structure of the present disclosure includes the following steps when a plurality of wafers is to be processed at a time: disposing the wafers on a temporary carrier; forming a RDL structure on a top surface of each of the wafers to be electrically connected thereto; forming a plurality of first cutting grooves on the wafers and the RDL structure correspondingly provided thereon in order to form a plurality of chips later, and each of chips having a RDL structure correspondingly provided thereon; forming a first molding compound layer of a molding compound structure on the RDL structure and in the first cutting grooves correspondingly provided on each of the wafers; removing the temporary carrier and processing bottom surfaces of the wafers to expose a bottom surface of each of the chips to be formed on the wafers and to expose portions of the first molding compound layer that are filled in the first cutting grooves on the wafers; and then, forming a second molding compound layer of the molding compound structure on the bottom surfaces of the chips and on the exposed portions of the first molding compound layer on each of the chips; forming a plurality of second cutting grooves on the portions of the first molding compound layer that are filled in the first cutting grooves and on portions of the second molding compound layer that are located corresponding to the first cutting grooves, so as to separate the chips on the wafers from one another; providing an electromagnetic interference (EMI) shielding structure on outer surfaces of the first and the second molding compound layer on each of the chips; and exposing the RDL structure on each of the chips.

With the above arrangements of the IC package structure of the present disclosure and the steps of the method for manufacturing the IC package structure, the forming of molding compound layers and EMI shielding layers on outer surfaces of the chip and the RDL structure can provide structural protection and enhancement as well as EMI protection to multiple faces of the IC package structure, so that the IC package structure of the present disclosure has enhanced structural strength as well as upgraded reliability and stability in use.

BRIEF DESCRIPTION OF THE DRAWINGS

FIG. 3A pictorially illustrates a first step in the method of manufacturing the IC package structure in the first embodiment of the present disclosure.

DETAILED DESCRIPTION OF THE INVENTION

To facilitate understanding of the objects, characteristics and effects of this present disclosure, embodiments together with the attached drawings for the detailed description of the present disclosure are provided. It is noted the present disclosure can be implemented or applied in other embodiments, and many changes and modifications in the described embodiments can be carried out without departing from the spirit of the disclosure, and it is also understood that the preferred embodiments are only illustrative and not intended to limit the present disclosure in any way.

Figure 1:
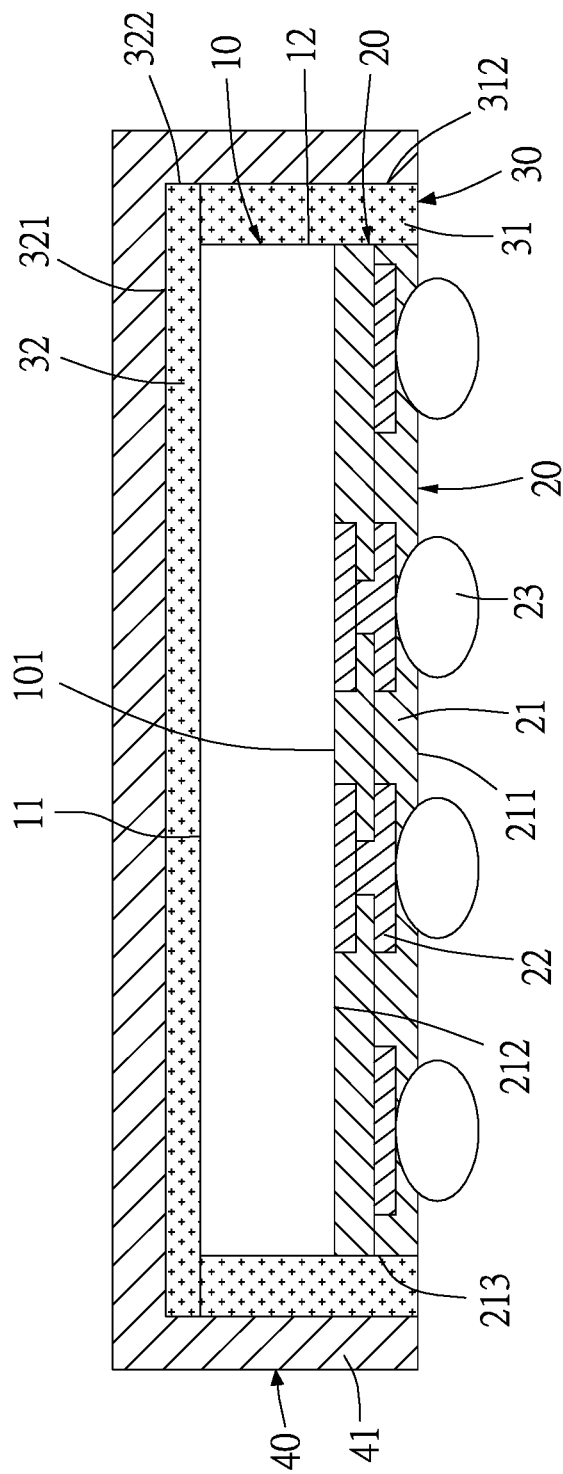
FIG. 1 is a sectional view of an integrated circuit (IC) package structure according to a first embodiment of the present disclosure.

Please refer to FIG. 1. An integrated circuit (IC) package structure according to a first embodiment of the present disclosure includes a chip 10, a redistribution layer (RDL) structure 20, a molding compound structure 30 and an electromagnetic interference (EMI) shielding structure 40. The RDL structure 20 is provided on the chip 10 and is electrically connected thereto. The molding compound structure 30 is provided on outer surfaces of the chip 10 and on outer surfaces of the RDL structure and the EMI shielding structure 40 is provided on outer surfaces of the molding compound structure 30.

Figure 2:
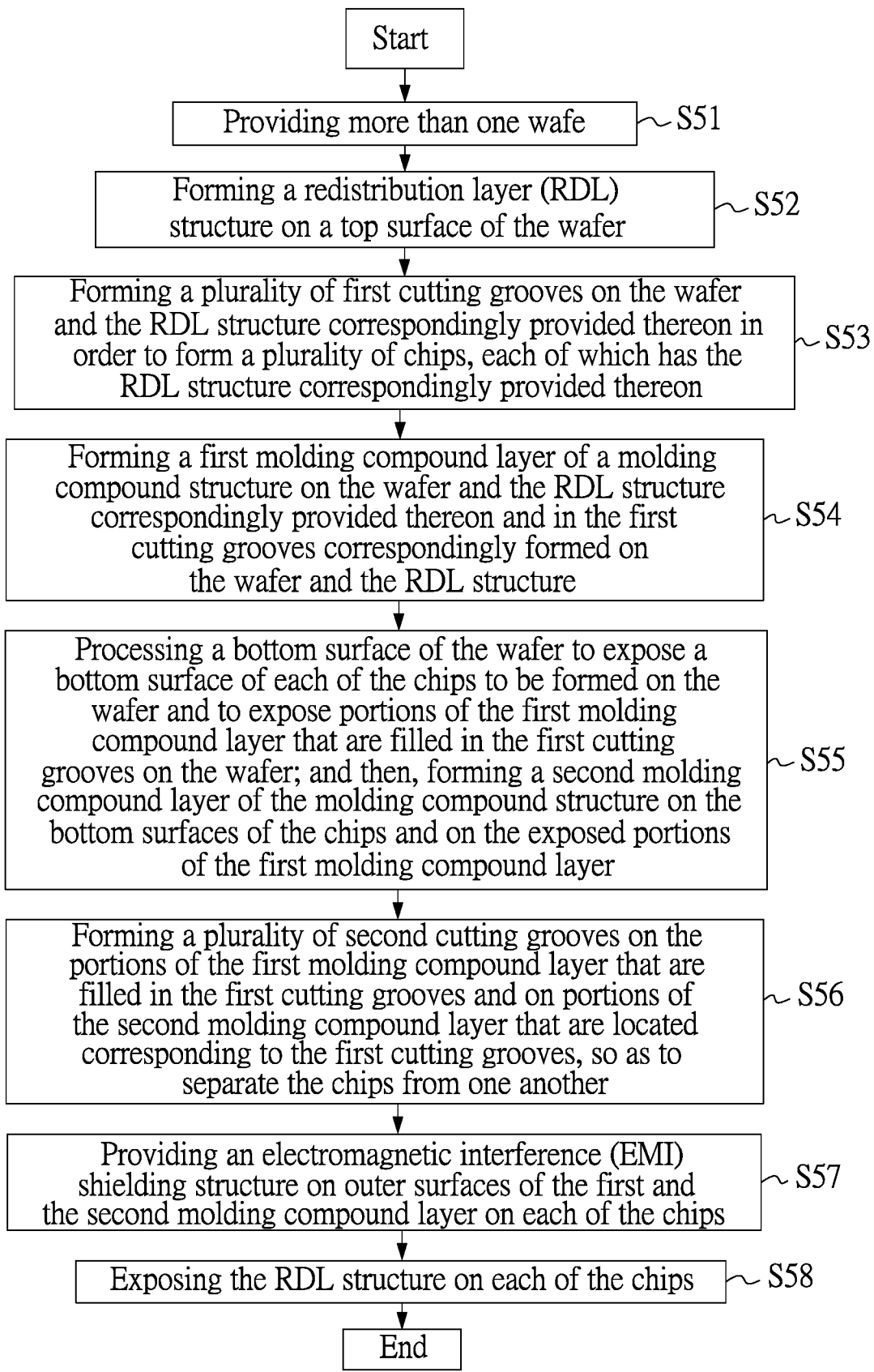
FIG. 2 is a flowchart showing steps included in a method of manufacturing the IC package structure in the first embodiment of the present disclosure.

FIG. 2 is a flowchart showing steps S51 to S58 included in a method for manufacturing the IC package structure according to the first embodiment of the present disclosure shown in FIG. 1.

Figure 3B:
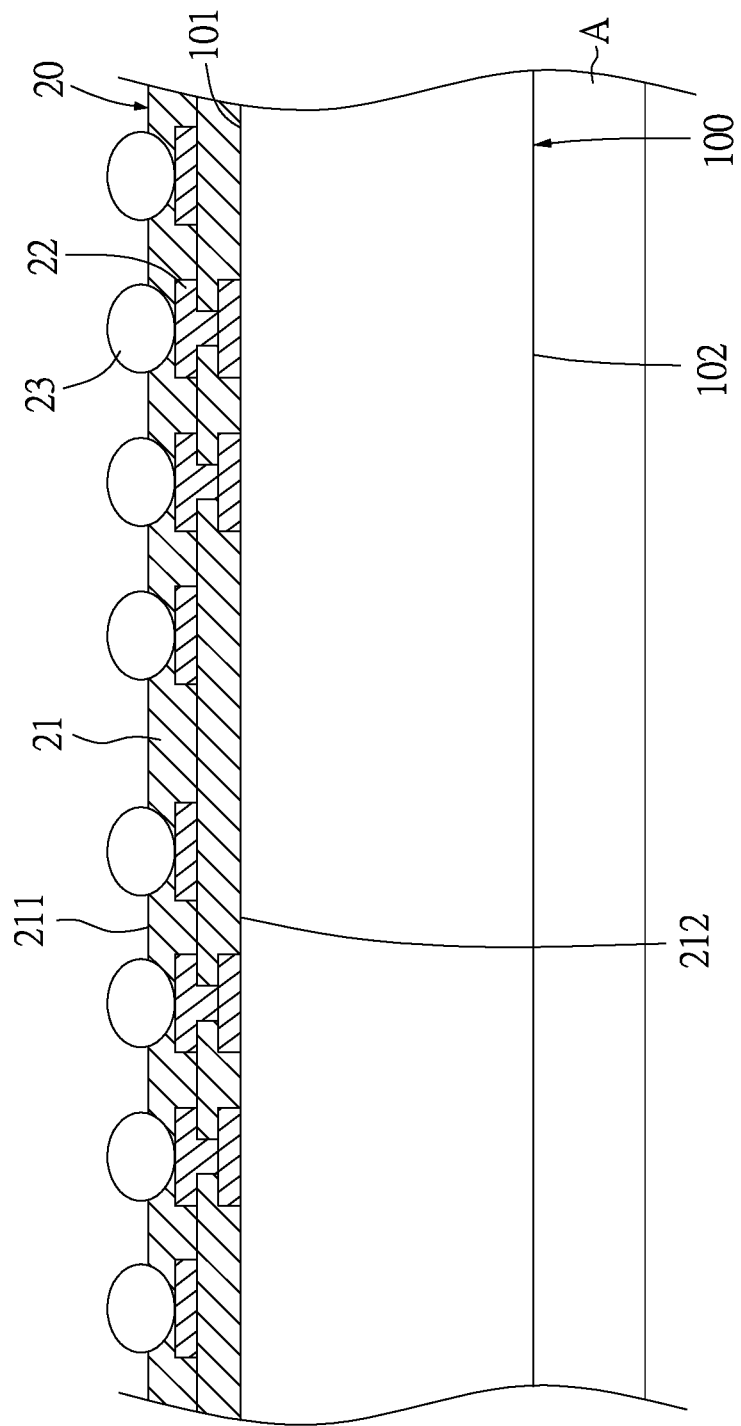
FIG. 3B pictorially illustrates a second step in the method of manufacturing the IC package structure in the first embodiment of the present disclosure.

FIGS. 3A and 3B pictorially illustrate steps S51 and S52 in FIG. 2, respectively. Please refer to FIG. 2 along with FIGS. 3A and 3B. In the step S51, more than one wafer 100 is provided. In one example, for the purpose of increasing production efficiency, a plurality of wafers 100 may be provided at a time and disposed on a temporary carrier "A". The temporary carrier "A" can be a printed circuit board (PCB), a glass substrate, a ceramic substrate or a temporary load-bearing jig. In one example, the wafers 100 disposed on the temporary carrier "A" are not limited to any particular shapes, they can be fully circular, semicircular, or quarter-circular in shape. By processing a large quantity of differently shaped wafers 100 at a time, it is possible to enable largely upgraded production efficiency. Moreover, the use of a conventional PCB forming process to handle subsequent circuit forming on the wafers 100 may effectively reduce the production cost thereof. Basically, each of the wafers 100 consists of a substrate and a plurality of circuit structures spaced on the substrate. The wafers 100 respectively have a first top surface 101 and an opposite first bottom surface 102. In one example, the first top surface 101 is an active surface of the circuit structure on the wafer 100; and the first bottom surface 102 is a bottom surface of the substrate of the wafer 100. Herein, for easy and clear explanation of the method, all the steps S51 to S58 are described on the basis of processing a plurality of wafers 100 at a time. Nevertheless, procedures in the manufacturing method of the present disclosure applied to the processing of one single wafer and multiple wafers at a time are the same with only one difference in the step S55. More specifically, in the case a plurality of wafers 100 is processed at a time, the wafers 100 are disposed on the temporary carrier "A", and accordingly, the temporary carrier "A" must first be removed before subsequent procedures in the step S55 can be started. On the other hand, in the case only one wafer 100 is processed at a time, the wafer 100 needs not to be disposed on any temporary carrier "A", and therefore, no temporary carrier "A" has to be removed in the step S55. Further, in another example, when necessary, the temporary carrier "A" may still be used even if there is only one wafer 100 to be processed at a time, so as to ensure upgraded reliability in production. In this example, the temporary carrier "A" must also be removed first in the step S55. A user may select the most suitable way according to actual need in manufacturing.

Please refer to FIGS. 2 and 3B. In the subsequent step S52, a redistribution layer (RDL) structure 20 is correspondingly provided on the first top surface 101 of each of the wafers 100. The RDL structure 20 includes a plurality of dielectric layers 21 and a plurality of circuit layers 22. The RDL structure 20 has a second top surface 211 and an opposite second bottom surface 212. The second bottom surface 212 of the RDL structure 20 is located on the first top surface 101 of the wafer 100. The circuit layers 22 are respectively provided in a corresponding one of the dielectric layers 21, and are electrically connected to circuit structures on the wafer 100. It is noted a part of the circuit layers 22 is exposed from the second top surfaces 211 of the RDL structure 20. Further, an electrical connecting layer 23 is provided on the second top surface 211 of the RDL structure 20 to be electrically connected to the circuit layers 22 that are exposed from the corresponding dielectric layers 21.

Wherein, the second top surface 211 of the RDL structure 20 forms a top surface of an outmost one of the dielectric layers 21. The second bottom surface 212 of the RDL structure 20 forms bottom surfaces of the dielectric layers 21 that are in contact with the wafer 100.

In one example, the electrical connecting layer 23 includes a plurality of solder balls, which provide improved electrical connection effect in future electrical connection of the chip 10 to other circuits.

Usually, the circuit structures on the wafers 100 have relatively small contact areas and are not easily connected with them. The circuit layers 22 of the RDL structure 20 serve as extension circuits to enhance the expandability, accuracy and reliability of circuit connection.

Figure 4:
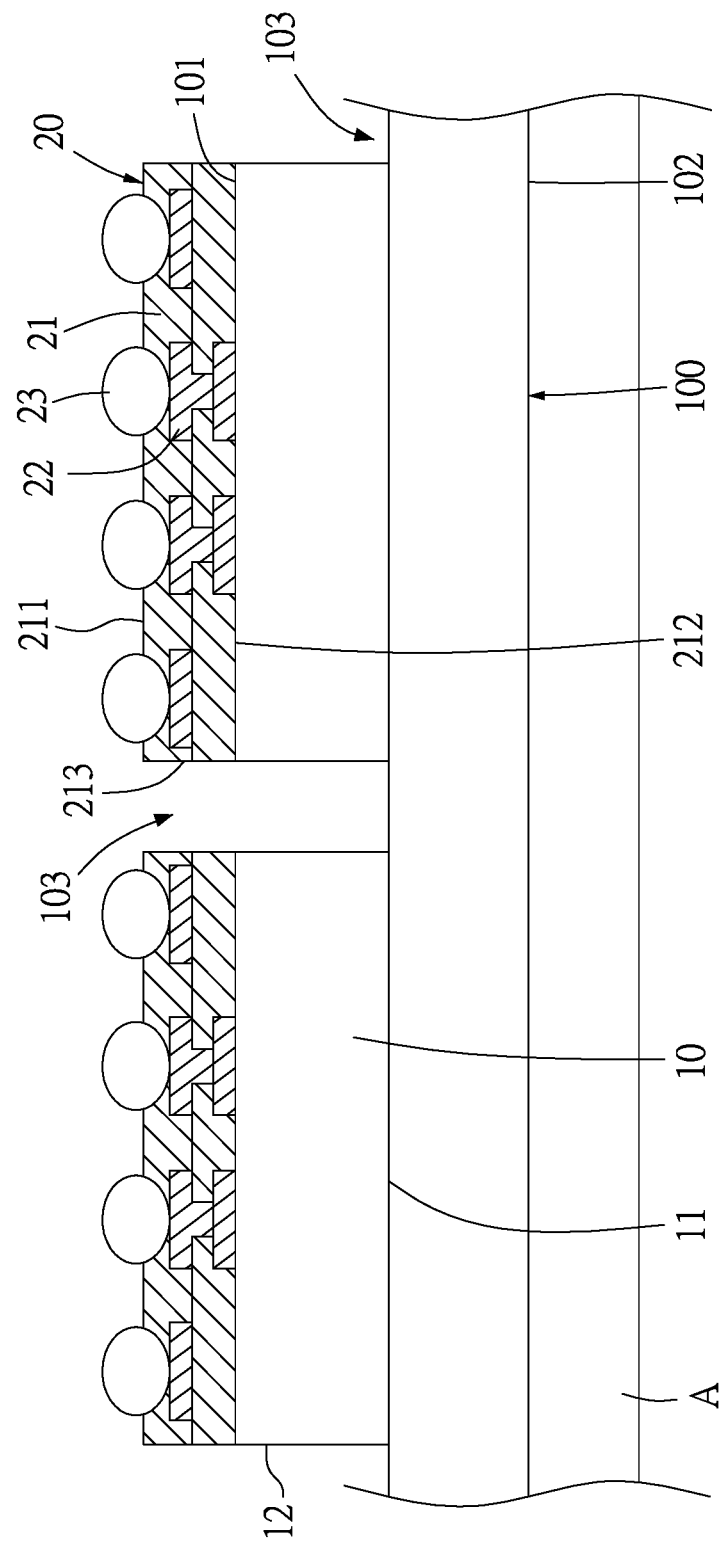
FIG. 4 pictorially illustrates a third step in the method of manufacturing the IC package structure in the first embodiment of the present disclosure.

FIG. 4 pictorially illustrates the step S53 in FIG. 2. Please refer to FIG. 2 along with FIG. 4. After the RDL structure 20 is provided on the wafers 100, a plurality of first cutting grooves 103 is formed on the wafers 100 and the RDL structure 20 correspondingly provided thereon. The first cutting grooves 103 are so cut that they are extended from the second top surface 211 of the RDL structure 20 toward the first bottom surface 102 of the wafer 100 by a predetermined depth. In one example, the first cutting grooves 103 can be formed using a laser cutter or a hub-type cutter.

After the first cutting grooves 103 are formed, the wafers 100 respectively form into a plurality of chips 10, each of which has a RDL structure 20 correspondingly provided thereon. Since the first cutting grooves 103 are extended into the wafers 100 by a predetermined depth without penetrating therethrough, the chips 10 so formed have not yet been completely separated from one another. These chips 10 respectively have a first top surface 101 the same as that of the wafers 100, a third bottom surface 11 that is connected to the wafer 100 and constitutes a passive surface of the chips 10, and a plurality of exposed outer side surfaces 12. Since each of the chips 10 on the wafers 100 has a RDL structure 20 correspondingly provided thereon, the circuit structure on each of the chips 10 is electrically connected to the corresponding RDL structure 20.

The RDL structure 20 is provided on an entire area of the first top surface 101 of each wafer 100 and the chips 10 formed of the wafer 100 respectively have the circuit layers 22 correspondingly provided thereon. That is, no circuit layer 22 will be provided on areas that do not form the chips 10. In other words, areas on the wafers 100 that are to be cut to form the first cutting grooves 103 are not provided with the circuit layers 22. After forming the first cutting grooves 103, the RDL structure 20 correspondingly provided on each of the chips 10 includes a plurality of exposed outer side surfaces 213 located corresponding to outer side surfaces of the dielectric layers 21.

The outer side surfaces 213 of the RDL structure 20 are located corresponding to the outer side surfaces 12 of the chips 10. In one example, the chips can be respectively a cuboid or a cube in shape. The RDL structure 20 correspondingly provided on each of the chips 10 can also be a cuboid or a cube in shape. In one example, the outer side surfaces 12 of the chips 10 include four faces; and the outer side surfaces 213 of the RDL structure 20 on the chip 10 also include four faces.

Figure 5:
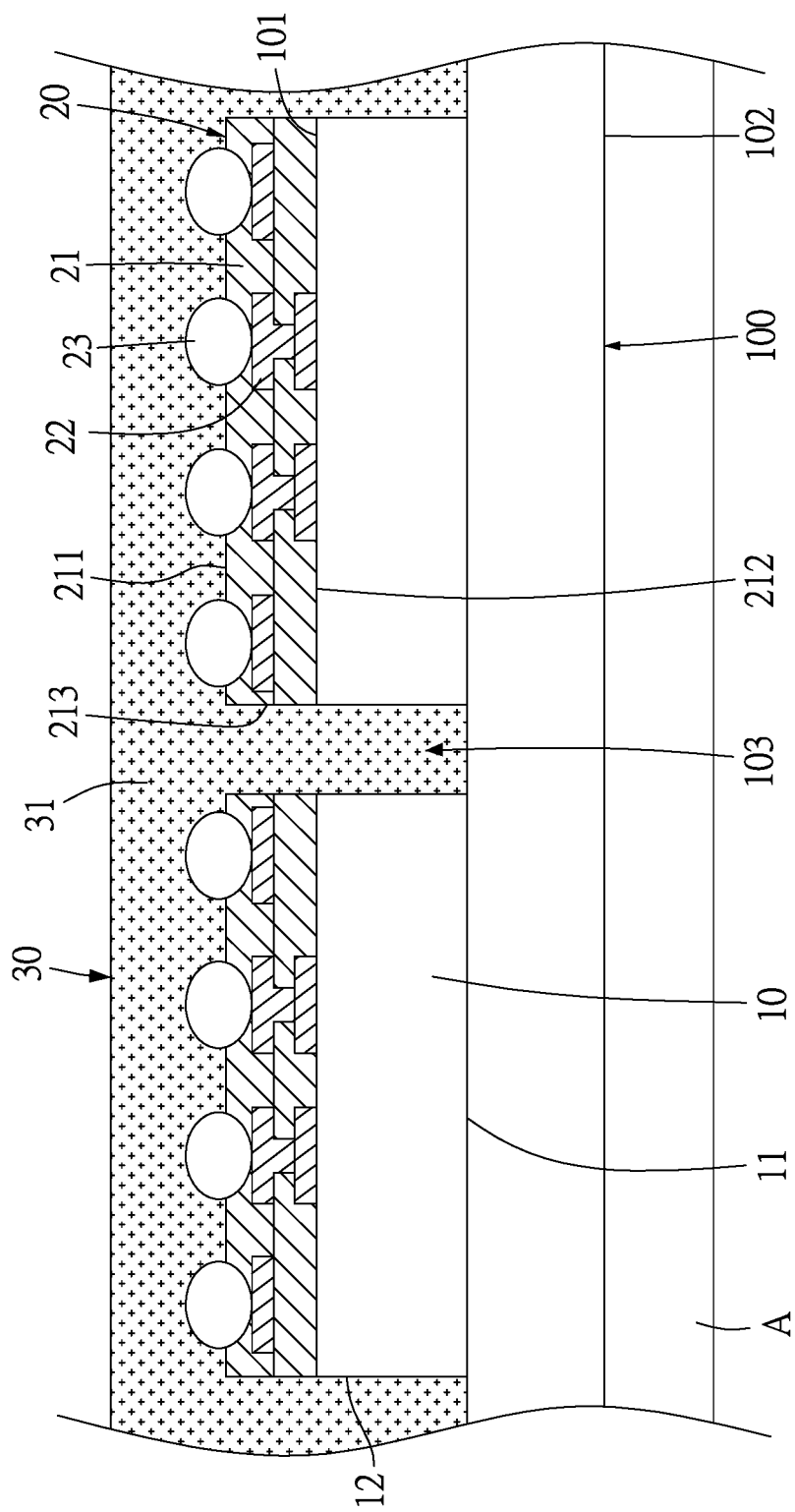
FIG. 5 pictorially illustrates a fourth step in the method of manufacturing the IC package structure in the first embodiment of the present disclosure.

FIG. 5 pictorially illustrates the step S54 in FIG. 2. Please refer to FIG. 2 along with FIGS. 4 and 5. After forming the first cutting grooves 103, a first molding compound layer 31 of a molding compound structure 30 is provided on each of the wafers 100 and the RDL structure 20 correspondingly provided thereon, and in the first cutting grooves 103. The first molding compound layer 31 not only covers the outer side surfaces 12 of the chips 10 formed of the wafers 100 and the outer side surfaces 213, the second top surface 211 and the electrical connecting layer 23 of each RDL structure 20, but also fills up the corresponding first cutting grooves 103. In one example, the first molding compound layer 31 can be an epoxy molding compound but not limited thereto.

Figure 6:
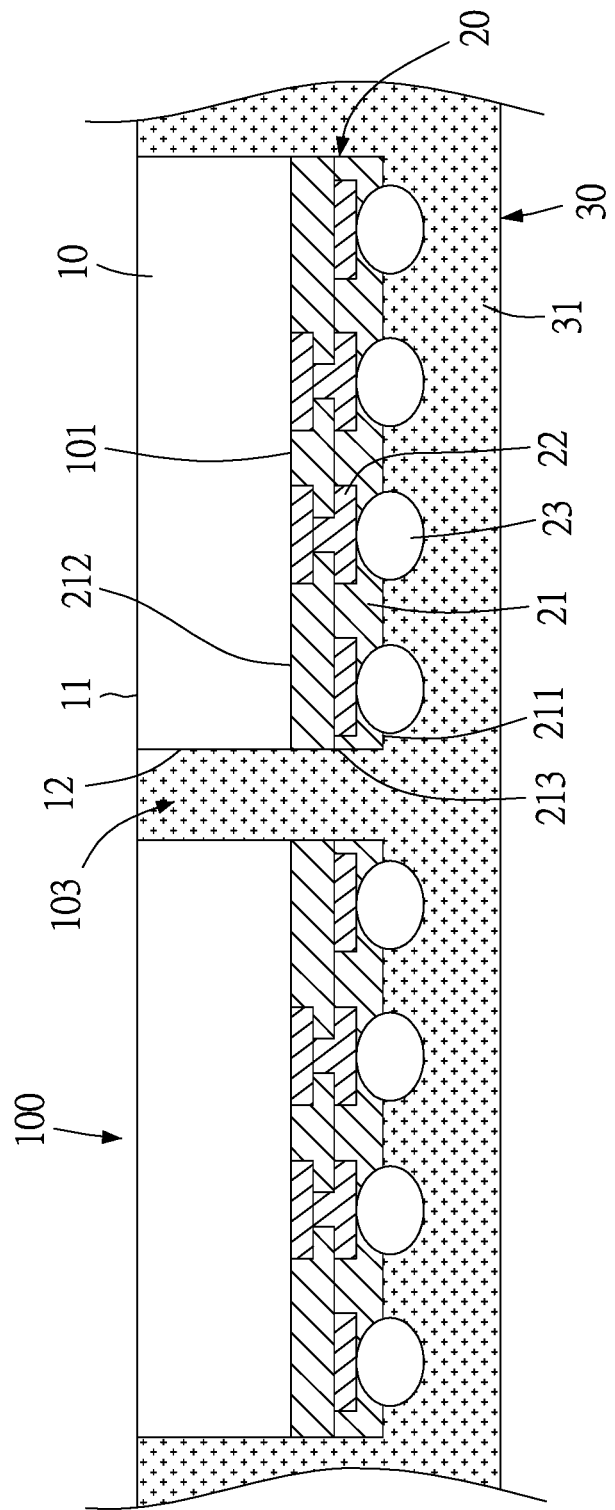
FIG. 6 pictorially illustrates a fifth step in the method of manufacturing the IC package structure in the first embodiment of the present disclosure.
Figure 7:
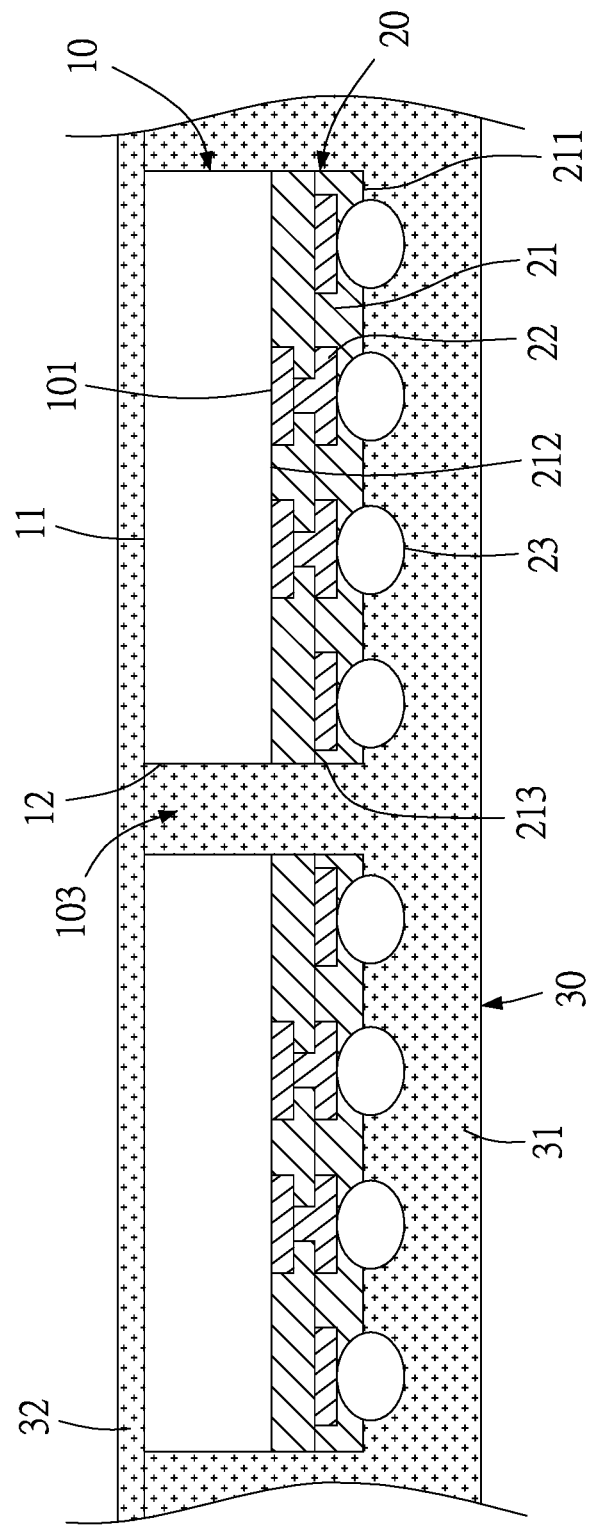
FIG. 7 pictorially illustrates a sixth step in the method of manufacturing the IC package structure in the first embodiment of the present disclosure.

FIGS. 6 and 7 pictorially illustrate the step S55 in FIG. 2, respectively. Please refer to FIG. 2 along with FIGS. 6 and 7. In the step S55, the temporary carrier "A" is removed and the wafers 100 are processed from the first bottom surfaces 102 to expose the third bottom surfaces 11 of the chips 10 formed of the wafers 10 and portions of the first molding compound layer 31 that are filled in the first cutting grooves 103 on the wafers 100. Then, a second molding compound layer 32 of the molding compound structure 30 is formed on the third bottom surfaces 11 of the chips and the exposed portions of the first molding compound layer 31. The first and the second molding compound layer 31, 32 are connected to each other to constitute the molding compound structure 30.

In one example, the processing of the first bottom surfaces 102 of the wafers 100 can be polishing. In the process of polishing, a part of the substrates of the wafers 100 is removed, so that the chips 10 formed of the wafers 100 temporarily become a plurality of individual bodies, and surfaces of the first molding compound layer 31 in the first cutting grooves 103 located adjacent to the third bottom surfaces 11 of the chips 10 are exposed. At this stage, the chips 10 have not yet been separated from one another because they are still fixedly held together by the first molding compound layer 31 and the second molding compound layer 32.

In one example, the second molding compound layer 32 of the molding compound structure 30 can be an epoxy molding compound but not limited thereto.

Figure 8:
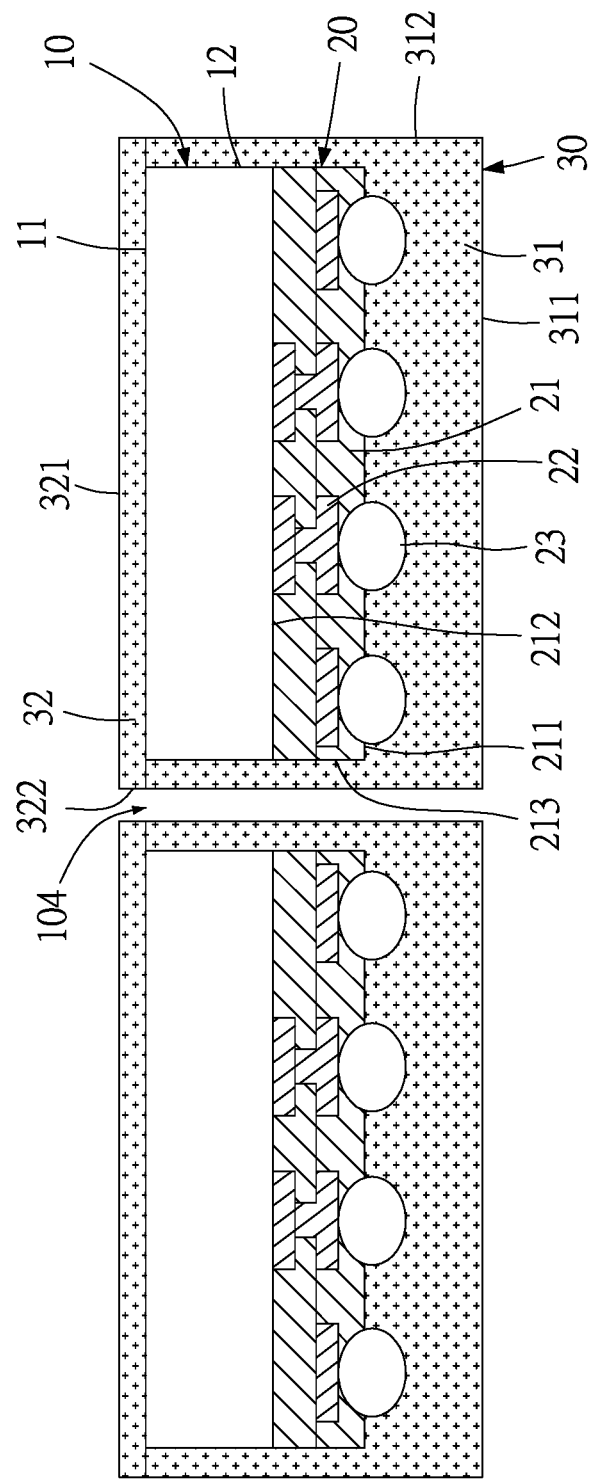
FIG. 8 pictorially illustrates a seventh step in the method of manufacturing the IC package structure in the first embodiment of the present disclosure.

FIG. 8 pictorially illustrates the step S56 in FIG. 2. Please refer to FIG. 2 along with FIGS. 7 and 8. In the step S56, a plurality of second cutting grooves 104 is formed on portions of the first molding compound layer 31 that are filled in the first cutting grooves 103 on the wafers 100 and on portions of the second molding compound layer 32 that are located corresponding to the first cutting grooves 103, so as to separate the chips 10 from one another. In one example, the second cutting grooves 104 can be formed using a laser cutter or a hub-type cutter. The first molding compound layer 31 and the second molding compound layer 32 are also cut apart into separated sections when the chips 10 are separated. Therefore, each of the separated chips 10 has the RDL structure 20, the first molding compound layer 31 and the second molding compound layer 32 correspondingly provided thereon. In one example, the second cutting grooves 104 respectively have a width smaller than that of the first cutting grooves 103.

In the above example, the first molding compound layer 31 has an exposed fourth top surface 311 and a plurality of exposed outer side surfaces 312; and the second molding compound layer 32 has an exposed fourth bottom surface 321 and a plurality of exposed outer side surfaces 322.

Figure 9:
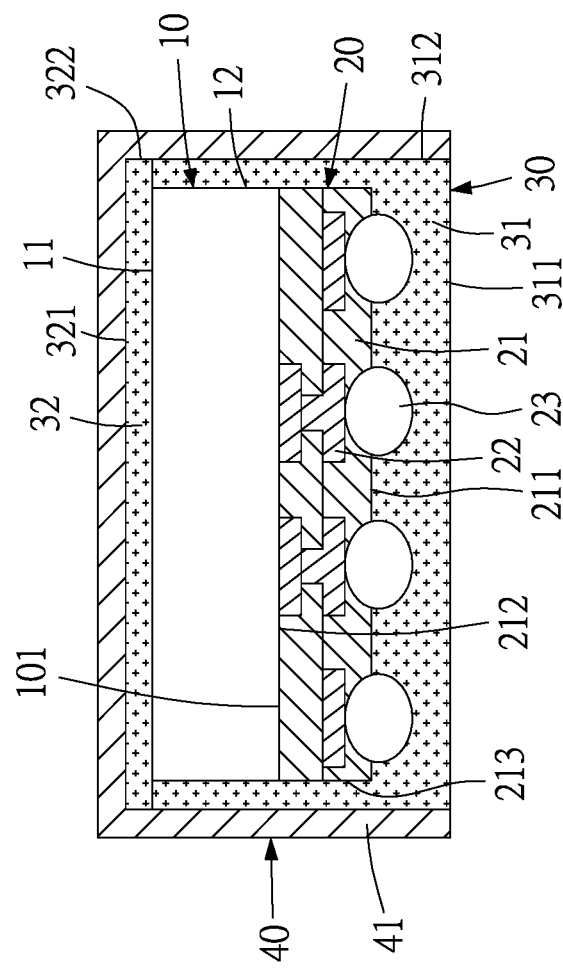
FIG. 9 pictorially illustrates an eighth step in the method of manufacturing the IC package structure in the first embodiment of the present disclosure.

FIG. 9 pictorially illustrates the step S57 in FIG. 2. Please refer to FIG. 2 along with FIG. 9. In the step S57, an electromagnetic interference (EMI) shielding structure 40 is provided on outer surfaces of the first and the second molding compound layer 31, 32 on each of the chips 10. For the purpose of clarity, only one chip 10 is illustrated and explained in FIG. 9. Before providing the EMI shielding structure 40, the separated chips 10 obtained in the step S56 as shown in FIG. 8 are first placed on a temporary tape. After the EMI shielding structure 40 is formed, the chips 10 are removed from the temporary tape (not shown).

The EMI shielding structure 40 includes a first EMI shielding layer 41 provided on the outer side surfaces 312 of the first molding compound layer 31, the fourth bottom surface 321 and the outer side surfaces 322 of the second molding compound layer 32.

The EMI shielding structure 40 can be made of a metal material. In one example, suitable metal materials for forming the EMI shielding structure 40 include, but not limited to, copper, nickel and gold.

Please refer to FIGS. 1, 2 and 9 at the same time. In a subsequent step S58 after the EMI shielding structure 40 is provided in the step S57, the first molding compound layer 31 is processed to expose the second top surface 211 and the electrical connecting layer 23 of the RDL structure 20 on each of the chips 10 from the first molding compound layer 31.

In one example, portions of the first molding compound layer 31 located on the second top surface 211 of the RDL structure 20 and portions of the first EMI shielding layer 41 located corresponding to the above portions of the first molding compound layer 31 are removed through a dry etching process, such as plasma etching, so that the second top surface 211 and a part of the electrical connecting layer 23 of the RDL structure 20 are exposed from the first molding compound layer 31.

In the IC package structure according to the first embodiment shown in FIG. 1, the RDL structure 20 is provided on the first top surface 101 of each chip 10; and the molding compound structure 30 is provided on the outer side surfaces 12 and the third bottom surface 11 of the chip 10 and on the outer side surfaces 213 of the RDL structure 20. In other words, the first molding compound layer 31 of the molding compound structure 30 is provided on the outer side surfaces 213 of the RDL structure 20 and the outer side surfaces 12 of the chip 10. Further, the second molding compound layer 32 of the molding compound structure 30 is provided on the third bottom surface 11 of the chip 10; and the first EMI shielding layer 41 of the EMI shielding structure 40 is provided on the outer side surfaces 312 of the first molding compound layer 31 and on the fourth bottom surface 321 and the outer side surfaces 322 of the second molding compound layer 32.

Figure 10:
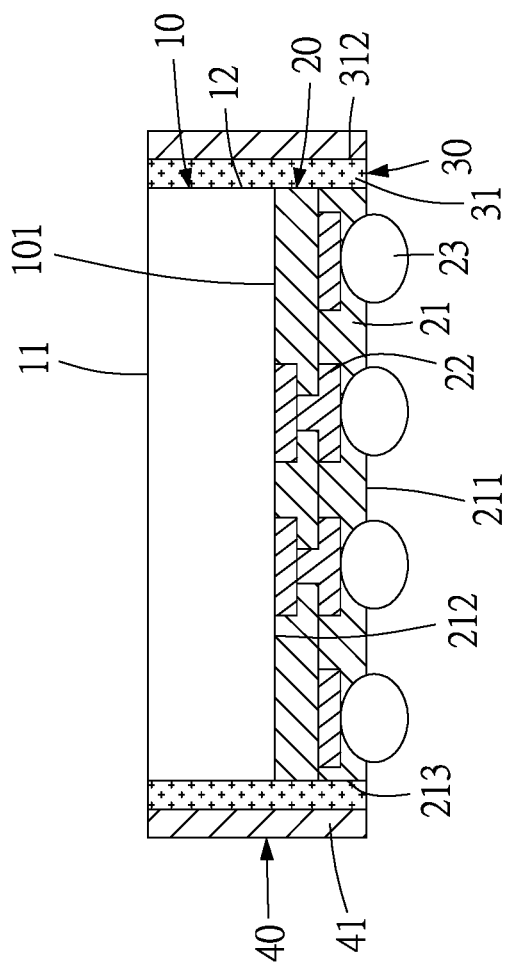
FIG. 10 is a sectional view of an IC package structure according to a second embodiment of the present disclosure.

Please refer to FIG. 10, in which an IC package structure according to a second embodiment of the present disclosure is shown. The second embodiment is generally similar to the first one, except that, in the second embodiment, the second molding compound layer 32 and portions of the first EMI shielding layer 41 provided on the outer side surfaces 322 and the fourth bottom surface 321 of the second molding compound layer 32 are removed to expose the third bottom surface 11 of the chip 10, surfaces of the first molding compound layer 31 corresponding to the third bottom surface 11 of the chip 10, and surfaces of the first EMI shielding layer 41 corresponding to the third bottom surface 11 of the chip 10. Therefore, in the second embodiment, total four faces of the IC package structure are protected against EMI.

Figure 11:
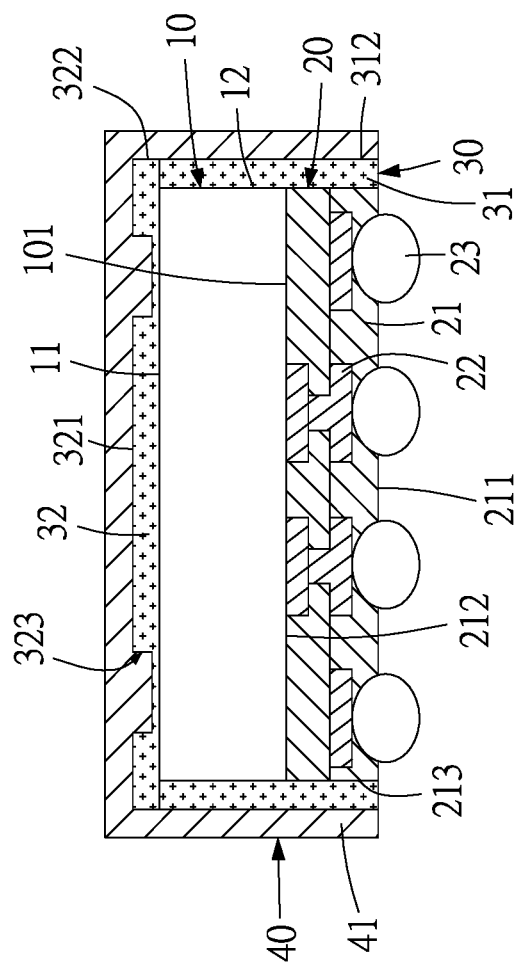
FIG. 11 is a sectional view of an IC package structure according to a third embodiment of the present disclosure.

Please refer to FIG. 11, in which an IC package structure according to a third embodiment of the present disclosure is shown. The third embodiment is generally similar to the first one, except that, in the third embodiment, the second molding compound layer 32 is formed on the fourth bottom surface 321 with a plurality of recesses 323 before the EMI shielding structure 40 is provided thereon. The recesses 323 are then covered and filled up by the first EMI shielding layer 41 of the EMI shielding structure 40 when the latter is provided on the outer side surfaces 312 of the first molding compound layer 31 and on the fourth bottom surface 321 and the outer side surfaces 322 of the second molding compound layer 32. These recesses 323 together constitute a heat dissipation structure, because portions of the first EMI shielding layer 41 at the recesses 323 are closer to the third bottom surface 11 of the chip 10, allowing heat produced by the chip 10 to dissipated into external environment via these portions of the first EMI shielding layer 41.

Figure 12:
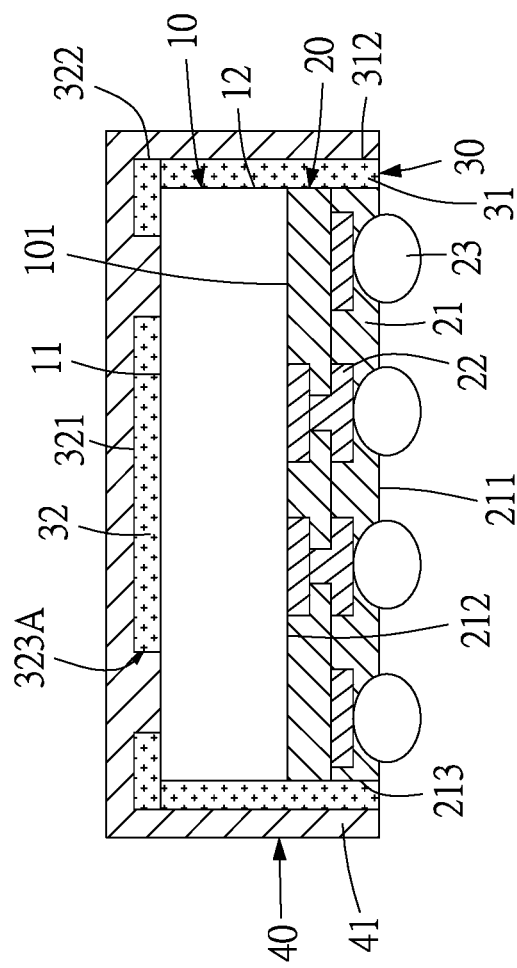
FIG. 12 is a sectional view of an IC package structure according to a fourth embodiment of the present disclosure.

Please refer to FIG. 12, in which an IC package structure according to a fourth embodiment of the present disclosure is shown. The fourth embodiment is generally similar to the above-described embodiments, except that, in the fourth embodiment, the second molding compound layer 32 is formed on the fourth bottom surface 321 with a plurality of through holes 323A before the EMI shielding structure is provided thereon. The through holes 323A are extended through the second molding compound layer 32 in a thickness direction thereof and are then covered and filled up by the first EMI shielding layer 41 of the EMI shielding structure 40 when the latter is provided on the outer side surfaces 312 of the first molding compound layer 31 and on the fourth bottom surface 321 and the outer side surfaces 322 of the second molding compound layer 32. These through holes 323A together constitute a heat dissipation structure because portions of the first EMI shielding layer 41 at the through holes 323A are in contact with the third bottom surface 11 of the chip 10, and heat produced by the chip 10 can be dissipated into external environment via these portions of the first EMI shielding layer 41. In this embodiment, the first EMI shielding layer 41 is not electrically connected to the chip 10.

Figure 13:
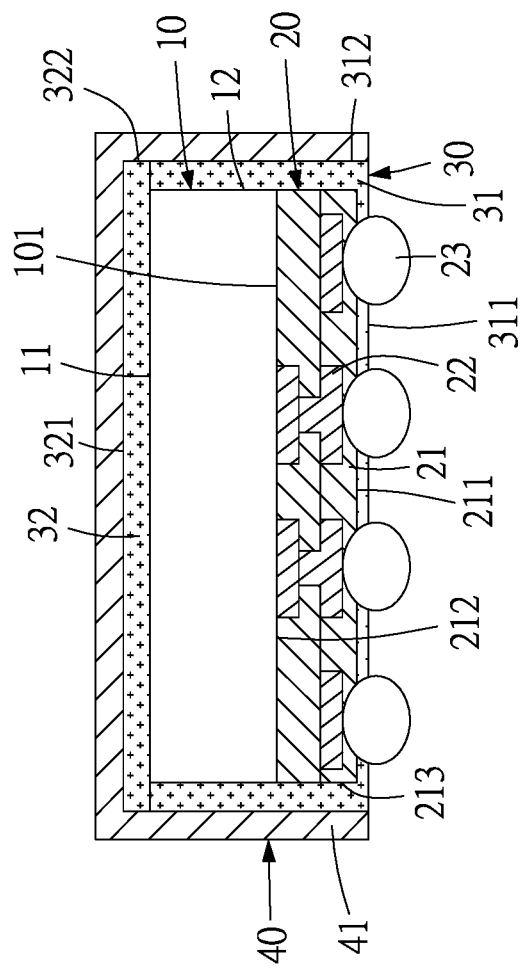
FIG. 13 is a sectional view of an IC package structure according to a fifth embodiment of the present disclosure.

Please refer to FIG. 13, in which an IC package structure according to a fifth embodiment of the present disclosure is shown. The fifth embodiment is generally similar to the above-described embodiments, except that, in the fifth embodiment, only a part of the first molding compound layer 31 and only portions of the first EMI shielding layer 41 corresponding thereto are removed in the step S58 of the method of the present disclosure, such that the remaining parts of the first molding compound layer 31 cover the second top surface 211 of the RDL structure 20 and the electrical connecting layer 23 are partially exposed from the first molding compound layer 31. Further, the first EMI shielding layer 41 is flush with the first molding compound layer 31 provided on the second top surface 211 of the RDL structure 20 to provide effective EMI protection. With the molding compound structure 30 that encloses the entire chip 10 and the RDL structure 20, total six faces of the IC package structure according to the fifth embodiment of the present disclosure are protected against EMI.

In one example, a thickness of the electrical connecting layer 23 that is exposed from the first molding compound layer 31 on the second top surface 211 of the RDL structure 20 is no less one half of an overall height of the electrical connecting layer 23. With this arrangement, the IC package structure is effectively protected against EMI while provides good electrical connection.

Figure 14:
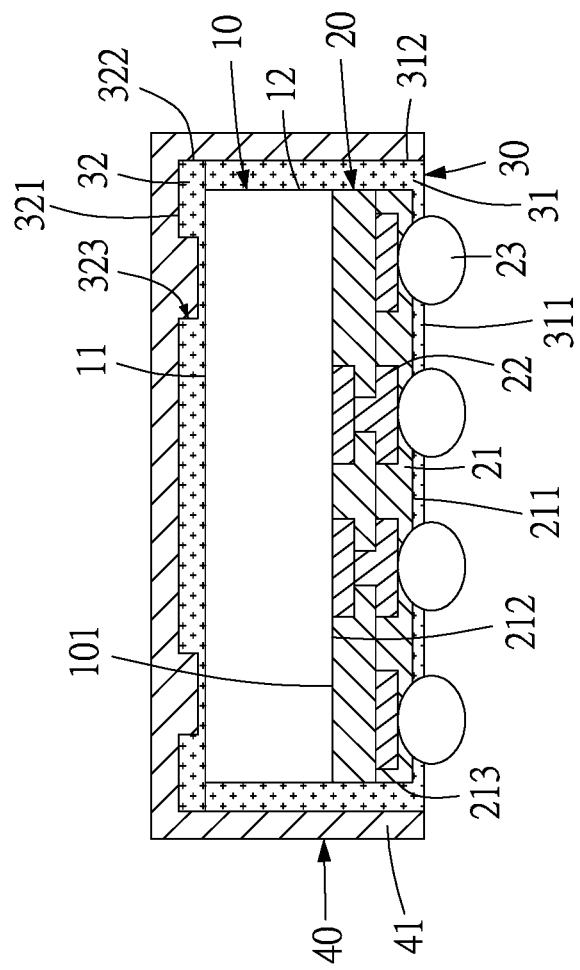
FIG. 14 is a sectional view of an IC package structure according to a sixth embodiment of the present disclosure.

Please refer to FIG. 14, in which an IC package structure according to a sixth embodiment of the present disclosure is shown. The sixth embodiment is generally similar to the fifth embodiment, except that, in the sixth embodiment, the second molding compound layer 32 is formed on the fourth bottom surface 321 with a plurality of recesses 323 before the EMI shielding structure 40 is provided thereon. The recesses 323 are then covered and filled up by the first EMI shielding layer 41 of the EMI shielding structure 40 when the latter is provided on the outer side surfaces 312 of the first molding compound layer 31 and on the fourth bottom surface 321 and the outer side surfaces 322 of the second molding compound layer 32. These recesses 323 together constitute a heat dissipation structure, because portions of the first EMI shielding layer 41 at the recesses 323 are closer to the third bottom surface 11 of the chip 10, allowing heat produced by the chip 10 to dissipated into external environment via these portions of first EMI shielding layer 41.

Figure 15:
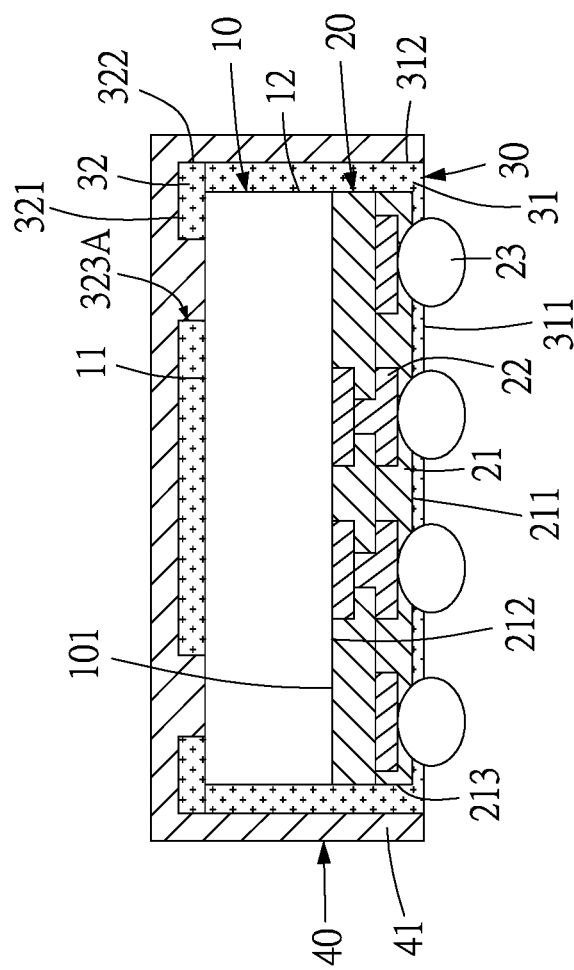
FIG. 15 is a sectional view of an IC package structure according to a seventh embodiment of the present disclosure.

Please refer to FIG. 15, in which an IC package structure according to a seventh embodiment of the present disclosure is shown. The seventh embodiment is generally similar to the fifth embodiment, except that, in the seventh embodiment, the second molding compound layer 32 is formed on the fourth bottom surface 321 with a plurality of through holes 323A before the EMI shielding structure 40 is provided thereon. The through holes 323A are extended through the second molding compound layer 32 in a thickness direction thereof and are then covered and filled up by the first EMI shielding layer 41 of the EMI shielding structure 40 when the latter is provided on the outer side surfaces 312 of the first molding compound layer 31 and on the fourth bottom surface 321 and the outer side surfaces 322 of the second molding compound layer 32. These through holes 323A together constitute a heat dissipation structure, because portions of the first EMI shielding layer 41 at the through holes 323A are in contact with the third bottom surface 11 of the chip 10, and heat produced by the chip 10 can be directly transferred to the first EMI shielding layer 41, from where the heat is dissipated into external environment. In this embodiment, the first EMI shielding layer 41 is not electrically connected to the chip 10.

Figure 16:
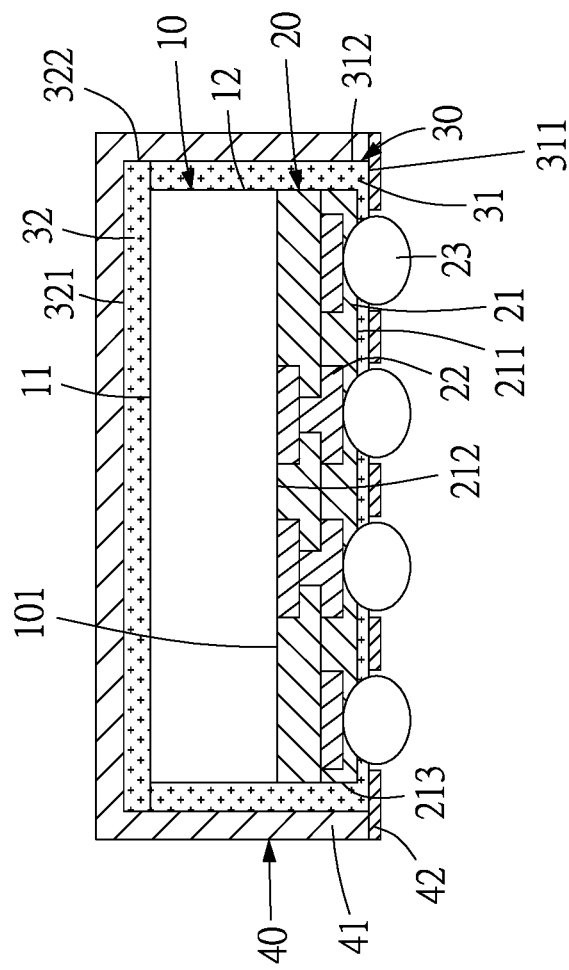
FIG. 16 is a sectional view of an IC package structure according to an eighth embodiment of the present disclosure.

Please refer to FIG. 16, in which an IC package structure according to an eighth embodiment of the present disclosure is shown. The eighth embodiment is generally similar to the fifth embodiment, except that, in the eighth embodiment, the EMI shielding structure 40 further includes a second EMI shielding layer 42, which is provided on the first molding compound layer 31 covering the second top surface 211 of the RDL structure 20 and the first EMI shielding layer 41. The second EMI shielding layer 42 is electrically connected to the first EMI shielding layer 41 but is spaced from the exposed electrical connecting layer 23 without being electrically connected thereto, so as to avoid signal interference and short circuit. Wherein, the second EMI shielding layer 42 can be formed of a metal material. In one example, metal materials suitable for forming the second EMI shielding layer 42 include, but not limited to, copper, nickel and gold. By providing the second EMI shielding layer 42, the second top surface 211 of the RDL structure 20 is also protected against EMI to ensure effective EMI protection to all six faces of the IC package structure.

Figure 17:
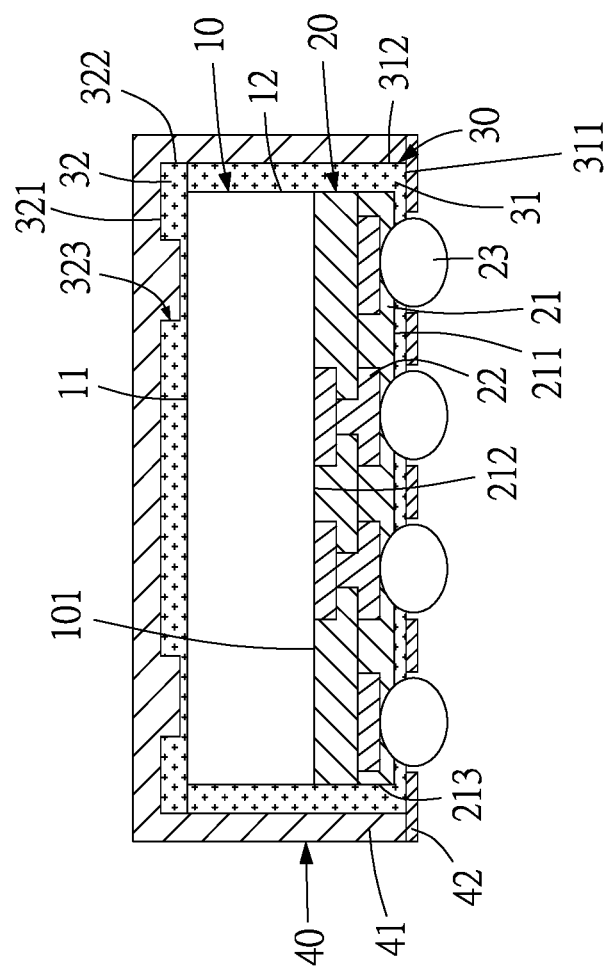
FIG. 17 is a sectional view of an IC package structure according to a ninth embodiment of the present disclosure.

Please refer to FIG. 17, in which an IC package structure according to a ninth embodiment of the present disclosure is shown. The ninth embodiment is generally similar to the eighth embodiment, except that, in the ninth embodiment, the second molding compound layer 32 is formed on the fourth bottom surface 321 with a plurality of recesses 323 before the EMI shielding structure 40 is provided thereon. The recesses 323 are then covered and filled up by the first EMI shielding layer 41 of the EMI shielding structure 40 when the latter is provided on the outer side surfaces 312 of the first molding compound layer 31 and on the fourth bottom surface 321 and the outer side surfaces 322 of the second molding compound layer 32. These recesses 323 together constitute a heat dissipation structure, because portions of the first EMI shielding layer 41 at the recesses 323 are closer to the third bottom surface 11 of the chip 10, allowing heat produced by the chip 10 to dissipated into external environment via these portions of the first EMI shielding layer 41.

Figure 18:
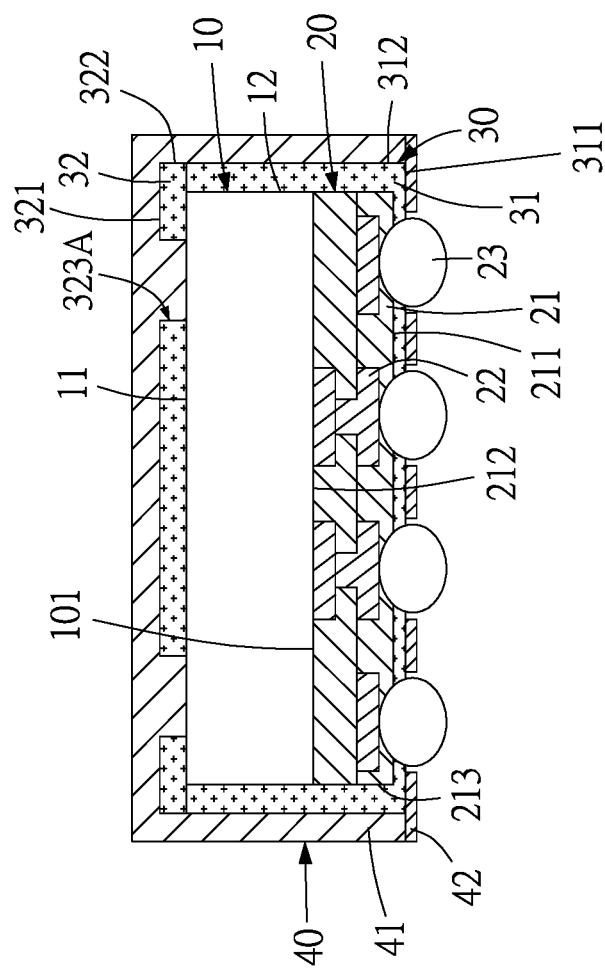
FIG. 18 is a sectional view of an IC package structure according to a tenth embodiment of the present disclosure.

Please refer to FIG. 18, in which an IC package structure according to a tenth embodiment of the present disclosure is shown. The tenth embodiment is generally similar to the eighth embodiment, except that, in the tenth embodiment, the second molding compound layer 32 is formed on the fourth bottom surface 321 with a plurality of through holes 323A before the EMI shielding structure 40 is provided thereon. The through holes 323A are extended through the second molding compound layer 32 in a thickness direction thereof and are then covered and filled up by the first EMI shielding layer 41 of the EMI shielding structure 40 when the latter is provided on the outer side surfaces 312 of the first molding compound layer 31 and on the fourth bottom surface 321 and the outer side surfaces 322 of the second molding compound layer 32. These through holes 323A together constitute a heat dissipation structure, because portions of the first EMI shielding layer 41 at the through holes 323A are in contact with the third bottom surface 11 of the chip 10, and heat produced by the chip 10 can be directly transferred to the first EMI shielding layer 41, from where the heat is dissipated into external environment. In this embodiment, the first EMI shielding layer 41 is not electrically connected to the chip 10.

In the method of the present disclosure, a plurality of wafers 100 is positioned on the temporary carrier "A", and the RDL structure 20 can be simultaneously formed on the wafers 100 to upgrade the manufacturing efficiency. Further, the forming of the molding compound structure 30 can protect and reinforce multiple faces of the chip 10 and the RDL structure 20. And, the forming of the EMI shielding structure 40 on the outer side surfaces of the molding compound structure corresponding to the chip 10 and the RDL structure 20 thereof also provides EMI protection to multiple faces of the IC package structure. Therefore, the IC package structure manufacturing according to the method of the present disclosure has enhanced structural strength, reliability and stability.

In some operable embodiments, a heat dissipation structure can be correspondingly formed on the second molding compound layer 32 to upgrade the heat dissipation effect and further ensure enhanced performance of the IC package structure.

In some of the above embodiments, the first molding compound layer 31 protects the outer side surfaces 12 of the chip 10 and the outer side surfaces 213 of the RDL structure 20, and the second molding compound layer 32 protects the third bottom surface 11 of the chip 10, so that total five faces of the IC package structure are protected. Further, with the first EMI shielding layer 41 formed on the outer side surfaces 312 of the first molding compound layer 31 and on the fourth bottom surface 321 and outer side surfaces 322 of the second molding compound layer 32, total five faces of the IC package structure are protected against EMI.

In some embodiments, the first molding compound layer 31 is remained on the second top surface 211 of the RDL structure 20 to provide necessary protection to the RDL structure 20, enabling upgraded reliability in use of the RDL structure 20 in subsequent connection to a printed circuit board. In these embodiments, total six faces, i.e. the top, bottom and four side faces, of the IC package structure are protected.

In some embodiments, the second EMI shielding layer 42 is formed on portions of the first molding compound layer 31 that are remained on the second top surface 211 of the RDL structure 20. The second EMI shielding layer 42 provides enhanced EMI protection to the RDL structure 20 or to the whole IC package structure during subsequent connection to the corresponding printed circuit board and during the operation thereof. For these embodiments, total six faces, i.e. the top, bottom and four side faces, of the IC package structure are protected against EMI, too.

While the present disclosure has been described by means of specific embodiments, numerous modifications and variations could be made thereto by those skilled in the art without departing from the scope and spirit of the present disclosure set forth in the claims.

What is claimed is:

1. An integrated circuit (IC) package structure, comprising:
   a chip having an active surface and a bottom surface opposite to the active surface;
   a redistribution layer (RDL) structure provided on the chip and be electrically connected thereto;
   a molding compound structure provided on outer surfaces of the chip and the RDL structure; and
   an electromagnetic interference (EMI) shielding structure provided on outer surfaces of the molding compound structure,
   wherein the molding compound structure includes:
   a first molding compound layer provided on a plurality of outer side surfaces of the chip and on a plurality of outer side surfaces of the RDL structure; and
   a second molding compound layer provided on the bottom surface of the chip and connected to the first molding compound layer,
   wherein the EMI shielding structure includes a first EMI shielding layer provided on a plurality of outer side surfaces of the first molding compound layer and on a plurality of outer side surface and a bottom surface of the second molding compound layer; and
   wherein the second molding compound layer is formed with a plurality of recesses, the recesses are disposed corresponding to the bottom surface of the chip, and the recesses being filled up by the first EMI shielding layer.

2. The IC package structure according to claim 1, wherein the second molding compound layer is formed on the bottom surface with the plurality of recesses.

3. The IC package structure according to claim 1, wherein the first molding compound layer further provided on a top surface of the RDL structure; and an electrical connecting layer provided on the top surface of the RDL structure being partially exposed from the first molding compound layer.

4. The IC package structure according to claim 3, wherein the EMI shielding structure further includes:
   a second EMI shielding layer provided on the first molding compound layer formed on the top surface of the RDL structure and being spaced from the exposed electrical connecting layer.

\* \* \* \* \*